United States Patent
McClure

(10) Patent No.: US 7,008,816 B2
(45) Date of Patent: *Mar. 7, 2006

(54) IMAGER PHOTO DIODE CAPACITOR STRUCTURE WITH REDUCED PROCESS VARIATION SENSITIVITY

(75) Inventor: Brent A. McClure, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/897,114

(22) Filed: Jul. 23, 2004

(65) Prior Publication Data

US 2005/0032281 A1     Feb. 10, 2005

Related U.S. Application Data

(63) Continuation of application No. 10/635,580, filed on Aug. 7, 2003, now Pat. No. 6,780,666.

(51) Int. Cl.
    *H01L 21/00*     (2006.01)
(52) U.S. Cl. .................... 438/57; 438/60; 438/257; 438/240; 438/301; 438/308; 438/244
(58) Field of Classification Search ............... 438/57, 438/60, 240–244, 257, 316, 301, 308; 250/208.1, 250/214.1
See application file for complete search history.

(56) References Cited

U.S. PATENT DOCUMENTS

| | | | | |
|---|---|---|---|---|
| 5,254,848 A | * | 10/1993 | Kashimura | 250/208.1 |
| 5,273,910 A | * | 12/1993 | Tran et al. | 438/69 |
| 5,296,696 A | * | 3/1994 | Uno | 250/208.1 |
| 5,464,984 A | * | 11/1995 | Cox et al. | 250/370.11 |
| 6,067,113 A | * | 5/2000 | Hurwitz et al. | 348/241 |
| 6,489,619 B1 | | 12/2002 | Street | |
| 6,720,592 B1 | * | 4/2004 | Kindt et al. | 257/231 |
| 6,780,666 B1 | * | 8/2004 | McClure | 438/57 |
| 6,821,808 B1 | * | 11/2004 | Nakamura et al. | 438/57 |
| 2002/0186813 A1 | * | 12/2002 | Tamura et al. | 378/98.8 |
| 2003/0164443 A1 | | 9/2003 | Henderson | |
| 2004/0099886 A1 | * | 5/2004 | Rhodes et al. | 257/222 |
| 2004/0099892 A1 | * | 5/2004 | Agarwal | 257/291 |

* cited by examiner

*Primary Examiner*—B. William Baumeister
*Assistant Examiner*—Igwe U. Anya
(74) *Attorney, Agent, or Firm*—Dickstein Shapiro Morin & Oshinsky LLP

(57) ABSTRACT

A pixel cell having two capacitors connected in series where each capacitor has a capacitance approximating that of the periphery capacitors and such that the effective capacitance of the series capacitors is smaller than that of each of the periphery capacitors. The series-connected capacitors are coupled to the floating diffusion (FD) region for receiving "surplus" charge from the FD region during saturation conditions.

10 Claims, 8 Drawing Sheets

IMAGER PHOTO DIODE CAPACITOR STRUCTURE WITH REDUCED PROCESS VARIATION SENSITIVITY

This application is a continuation of application Ser. No. 10/635,580, filed on Aug. 7, 2003, now U.S. Pat. No. 6,780,666 which is incorporated herein by reference.

FIELD OF THE INVENTION

The present invention relates generally to an imaging device and more specifically to a complementary metal oxide semiconductor (CMOS) pixel cell having series-connected array capacitors.

BACKGROUND OF THE INVENTION

Imaging devices, including charge coupled devices (CCD) and complementary metal oxide semiconductor (CMOS) sensors have commonly been used in photo-imaging applications.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, U.S. Pat. No. 6,333,205 to Rhodes, and U.S. Patent Appln. Pub. No. 2002/0117690. The disclosures of each of the forgoing are hereby incorporated by reference in their entirety.

An imager, for example, a CMOS imager includes a focal plane array of pixel cells, each cell includes a photosensor, for example, a photogate, a photoconductor, or a photodiode overlying a substrate for producing a photo-generated charge in a doped region of the substrate. A readout circuit is provided for each pixel cell and includes at least a source follower transistor and a row select transistor for coupling the source follower transistor to a column output line. The pixel cell also typically has a floating diffusion node, connected to the gate of the source follower transistor. Charge generated by the photosensor is sent to the floating diffusion node. The imager may also include a transfer transistor for transferring charge from the photosensor to the floating diffusion node and a reset transistor for resetting the floating diffusion node to a predetermined charge level prior to charge transference.

A conventional pixel cell 10 of an image sensor, such as a CMOS imager, is illustrated in FIG. 1. Pixel cell 10 typically includes a photodiode 12 having a p-region 12a and n-region 12b in a p-substrate 14. The pixel also includes a transfer transistor with associated gate 16, a floating diffusion region 18 formed in a more heavily doped p-type well 20, and a reset transistor with associated gate 22. Photons striking the surface of the p-region 12a of the photodiode 12 generate electrons that are collected in the n-region 12b of the photodiode 12. When the transfer gate 16 is on, the photon-generated electrons in the n-region 12b are transferred to the floating diffusion region 18 as a result of the potential difference existing between the photodiode 12 and floating diffusion region 18. Floating diffusion region 18 is coupled to the gates of a source follower transistor 24, which receives the charge temporarily stored by the floating diffusion region 18 and transfers the charge to a first source/drain terminal of a row select transistor and associated gate 26. When the row select signal RS goes high, the photon-generated charge is transferred to the column line 28 where it is further processed by a sample/hold circuit and signal processing circuits (not shown).

In the operation of the pixel cell 10 illustrated in FIG. 1, the charge accumulated in the photodiode 12 is typically transferred by the transfer transistor gate 16 to the floating diffusion region 18. The transfer transistor gate 16 is activated when the charge accumulated in the photodiode 12 reaches a predetermined level. Once activated, the charge is transferred from the photodiode 12 to the floating diffusion region 18.

One problem associated with the FIG. 1 pixel cell 10 is that the floating diffusion region 18 can absorb charge only up to its saturation level. Once the floating diffusion region 18 has reached its saturation level, it cannot respond any longer to incoming electrons from the photodiode 12. The "surplus" charge in the photodiode 12 that can no longer be transferred to the saturated floating diffusion region 18 is typically transferred to adjacent pixel cells, and their associated charge collection regions. The surplus charge often leads to image lag and "blooming" in adjacent pixel cells. Blooming results from the overflow of charge from one pixel cell to the next and can create a bright spot or streak in a resultant image.

Referring to FIG. 2, one method of increasing the storage capacity of a floating diffusion region 18 of a pixel cell 10 is to form a capacitor 34 (known as an array capacitor) that is electrically connected to the floating diffusion region 18. Exemplary CMOS imaging circuits, processing steps thereof, and detailed descriptions of the functions of a CMOS imager having a capacitor connected to the floating diffusion region are described in U.S. Patent Appln. Pub. No. 2002/0117690 to Rhodes. The disclosure of the foregoing is hereby incorporated by reference in its entirety.

Although the addition of the array capacitor 34 increases the capacitance of the floating diffusion region 18, and thereby allows for higher saturation limits, the addition of a capacitor to a pixel cell has its own drawbacks. For example, the capacitor 34 is typically formed at the same time as the periphery capacitors (those formed outside of the pixel cell). The periphery capacitors are part of the sample and hold circuits external to the pixel cell 10 and are used to store the reference (full signal) and the output signal of an associated photodiode 12 of each pixel cell 10. The periphery capacitors are typically formed having a higher capacitance than that which is required for the array capacitor 34 connected to the floating diffusion region 18. Having a high capacitance array capacitor 34 leads to certain problems including image lag and charge transfer inefficiency. Therefore, optimally, the array capacitor 34 in pixel cell 10 should have a capacitance lower than that of the periphery capacitor.

There are, however, several disadvantages associated with reducing the capacitance of array capacitor 34 of pixel cell 10. For example, a conventional method of reducing capacitance includes increasing the thickness of the capacitor's dielectric layer. Increasing the dielectric thickness, however, also decreases capacitance in the periphery capacitors, as the array capacitor (e.g., 34) and the periphery capacitors are formed simultaneously. Therefore, additional process steps must be taken to ensure that the dielectric layer thickness of the periphery capacitors is smaller than that of the array capacitor 34. Such additional process steps are costly and reduce manufacturing throughput potentials.

Another method of decreasing capacitance of array capacitor 34 is by scaling the capacitor 34. By reducing the size of the capacitor 34, the area of the capacitor (and capacitance) will decrease as well. However, the reduction in size increases the overall amount of variation in capacitance from one array capacitor to another array capacitor (e.g., of another pixel cell) due to difficulties in maintaining critical dimension (CD) control during the photolithography process. Therefore, as the physical size of the capacitor is reduced, the percentage of CD error due to photolithography and etch processing increases. As a result, the capacitance in the resulting array capacitor varies greatly, and cannot be formed consistently. Thus, it is desirable to develop an array capacitor for storing additional charge from the floating diffusion region with reduced capacitance as compared with the periphery capacitors. Further, such array capacitors should be easily manufactured with consistent results.

BRIEF SUMMARY OF THE INVENTION

The present invention addresses the above-described problems and discloses a pixel cell having an array capacitance that is smaller than the periphery capacitors, easily integrated into current manufacturing techniques, with consistent results.

BRIEF DESCRIPTION OF THE DRAWINGS

The above-described features and advantages of the invention will be more clearly understood from the following detailed description, which is provided with reference to the accompanying drawings in which.

DETAILED DESCRIPTION OF THE INVENTION

As used herein, the terms "semiconductor substrate" and "substrate" are to be understood to include any semiconductor-based structure. The semiconductor structure should be understood to include silicon, silicon-on-insulator (SOI), silicon-on-sapphire (SOS), silicon-germanium, doped and undoped semiconductors, epitaxial layers of silicon supported by a base semiconductor foundation, and other semiconductor structures. The semiconductor need not be silicon-based. The semiconductor could be germanium or gallium arsenide. When reference is made to the semiconductor substrate in the following description, previous process steps may have been utilized to form regions or junctions in or over the base semiconductor or foundation.

The term "pixel cell," as used herein, refers to a photo-element unit cell containing a photosensor for converting photons to an electrical signal. For purposes of illustration, a single representative pixel and its manner of formation are illustrated in the figures and description herein; however, typically fabrication of a plurality of like pixels proceeds simultaneously. Accordingly, the following detailed description is not to be taken in a limiting sense.

Figure 3:
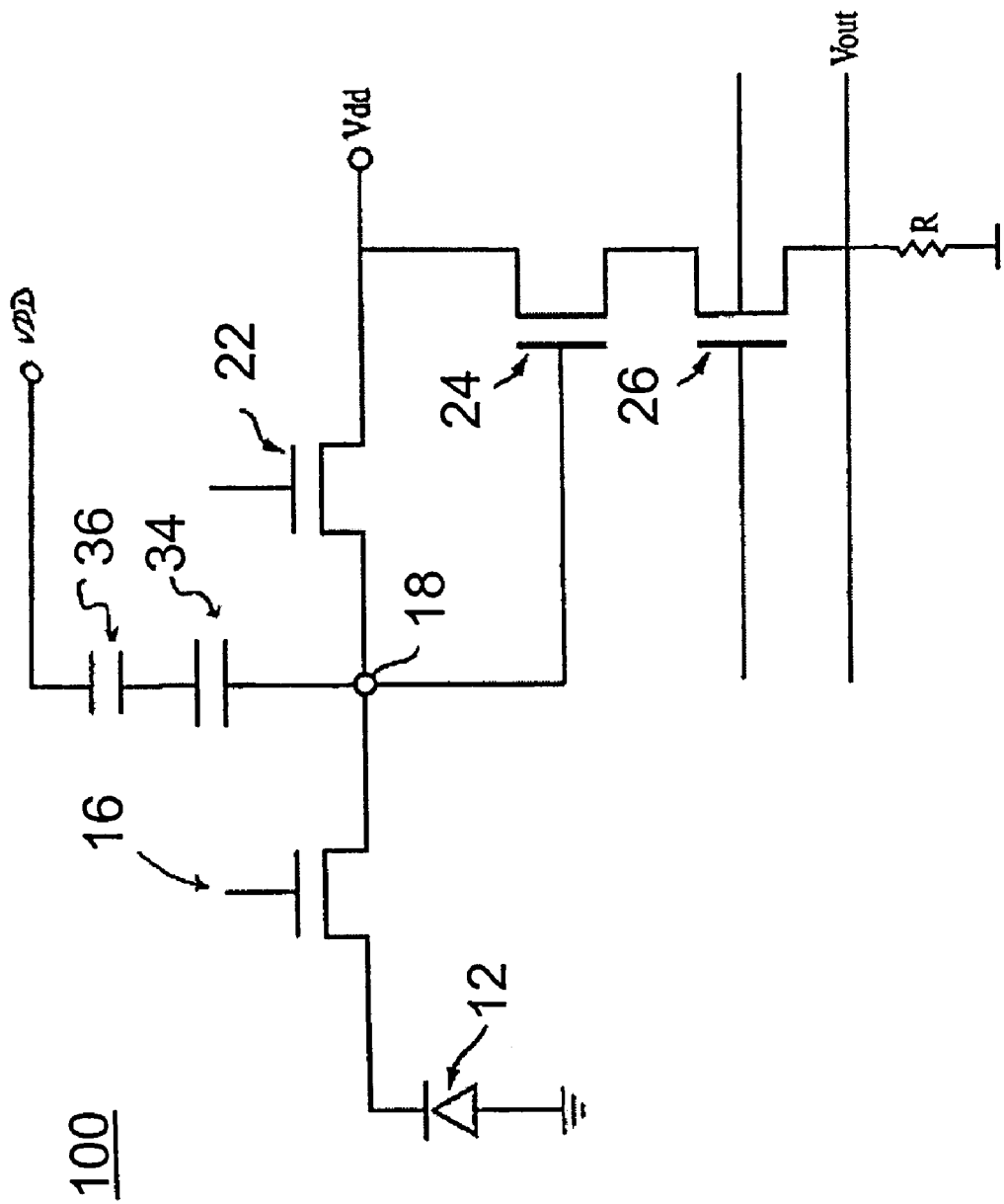
FIG. 3 illustrates a schematic representation of a pixel cell constructed in accordance with an exemplary embodiment of the invention.

In the following description, the invention is described in relation to a CMOS imager for convenience; however, the invention has wider applicability to any photosensor of any imager cell, including a charge coupled device (CCD). Referring to FIG. 3, a schematic diagram of a pixel cell 100 constructed in accordance with an exemplary embodiment of the invention is illustrated.

Pixel cell 100 has two array capacitors 34, 36 electrically connected in series. The series connection effectively decreases the overall array capacitance in accordance with the following equation:

$$C_{array} = \frac{C_{34} * C_{36}}{C_{34} + C_{36}} \tag{1}$$

wherein $C_{34}$ represents the capacitance of the first capacitor 34, and $C_{36}$ represents the capacitance of the second capacitor 36. The array capacitors 34, 36 and floating diffusion region 18 are electrically connected in parallel to a source follower transistor 24 between the Vdd terminal and the gat of transistor 24. It should be noted that equation (1) is applicable for array capacitors 34, 36, each having a capacitance of less than 1 F.

In accordance with an exemplary embodiment of the invention, the periphery (sample/hold) and array capacitors (e.g. 34, 36) may be formed simultaneously without any additional steps. That is, the series-connected array capacitors 34, 36 can have capacitance values substantially similar to that of the periphery capacitors.

It should be noted that, although only two array capacitors 34, 36 are illustrated in the exemplary pixel cell 100 of FIG. 3, the pixel cell 100 could include more than two capacitors electrically connected in series. Further, although pixel cell 100 is depicted as a four-transistor (4T) configuration, the invention can also be practiced with a three-transistor (3T) configuration (e.g., without a transfer transistor 16) or in other pixel cell configurations having fewer or more transistors. It should also be noted that the two array capacitors 34, 36 could be flat plate capacitors, trench capacitors, stud capacitors, or a combination thereof, or any other type of capacitor known to be used in the art.

Figure 1:
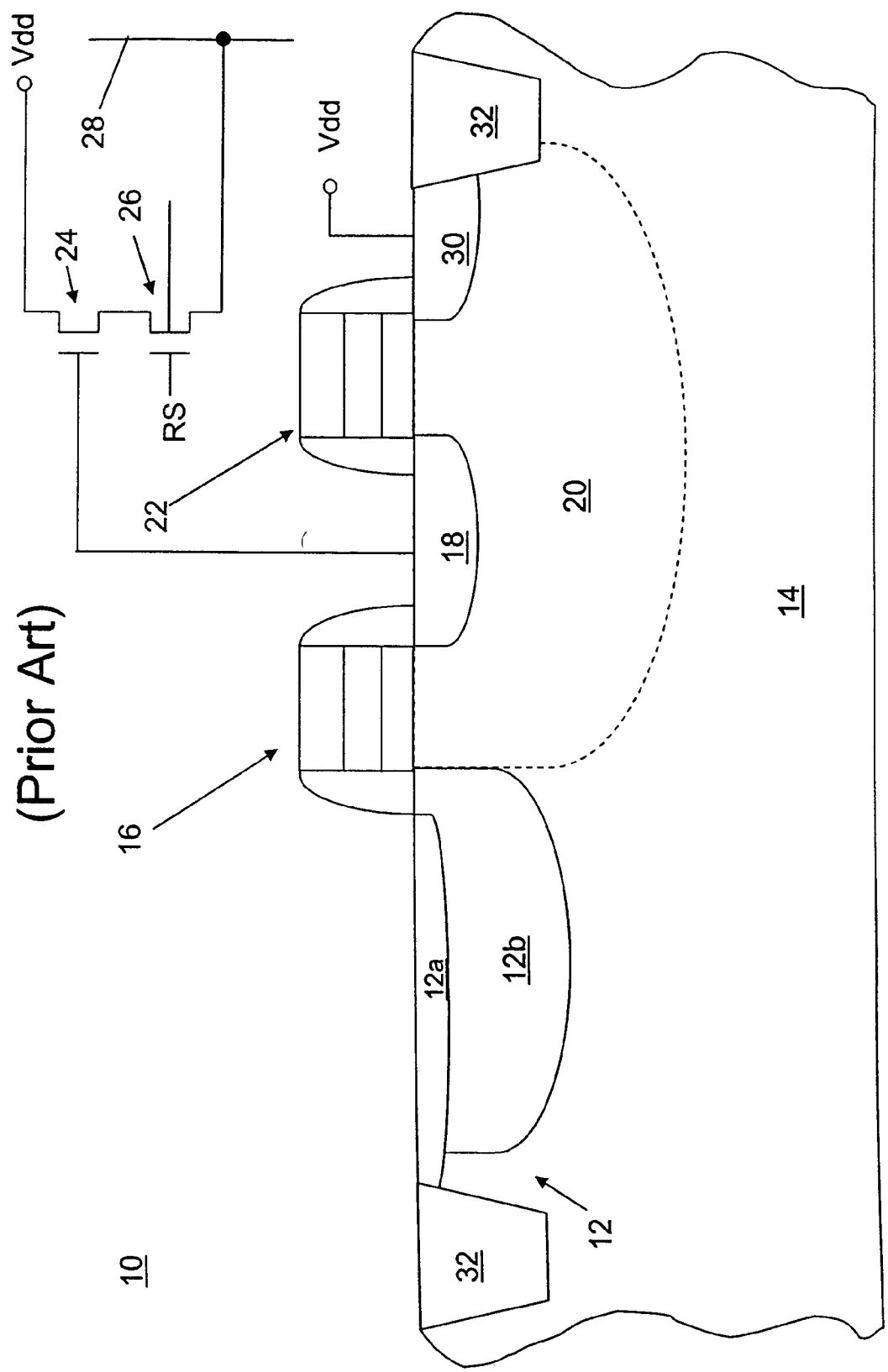
FIG. 1 illustrates a conventional pixel cell.
Figure 2:
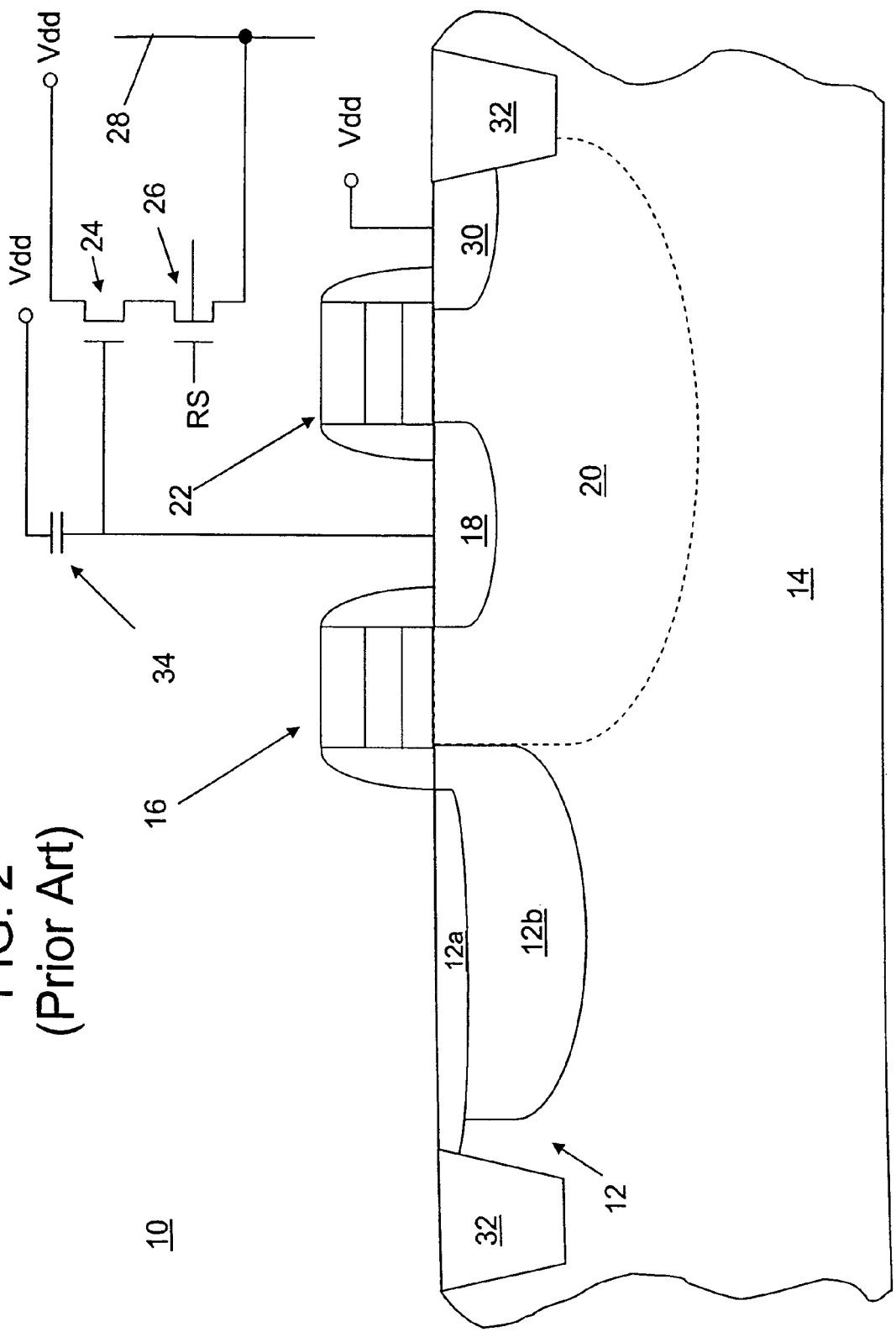
FIG. 2 illustrates a second conventional pixel cell.
Figure 4:
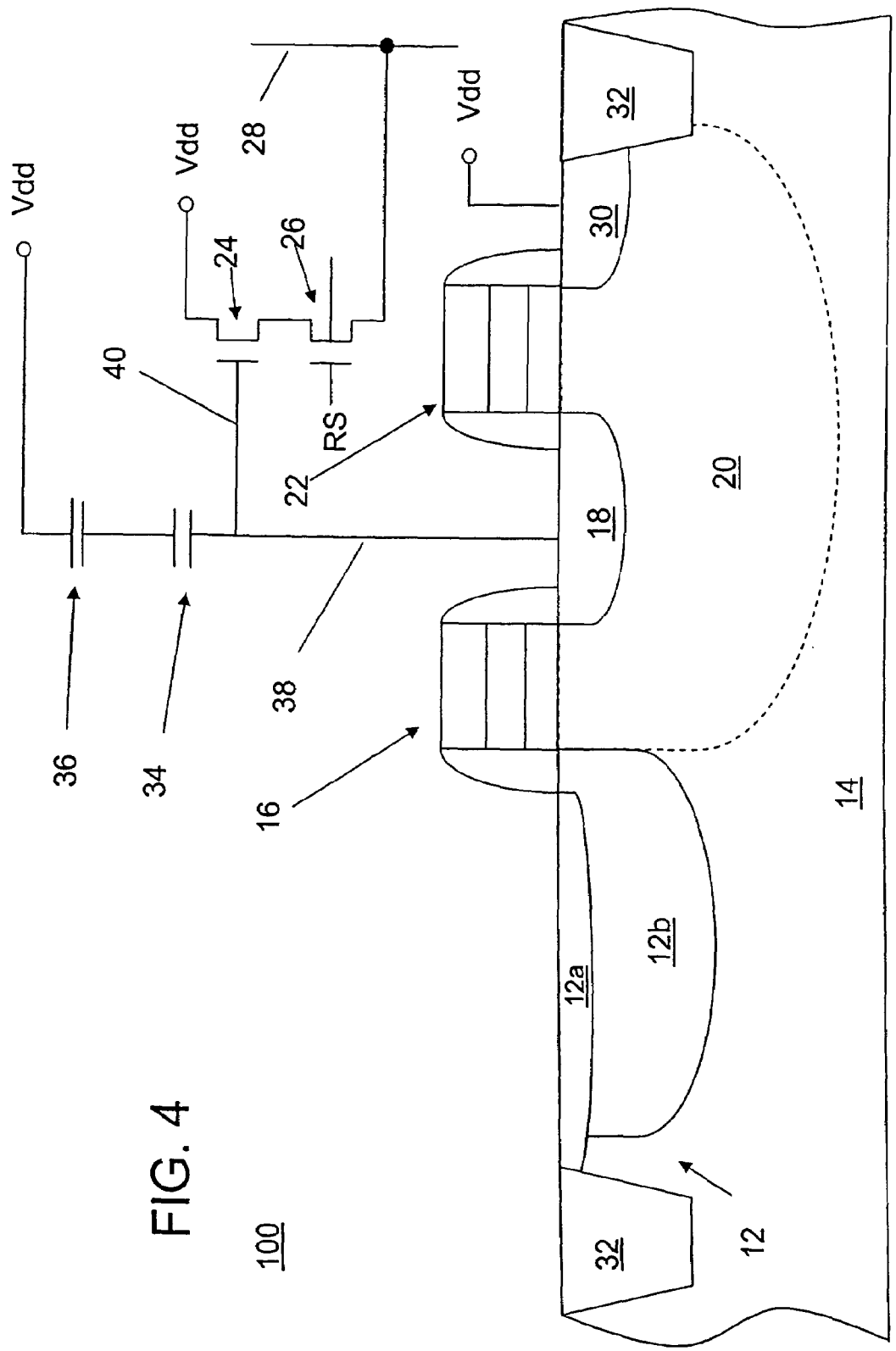
FIG. 4 illustrates a partial cross-sectional representation of the FIG. 3 pixel cell.

FIG. 4 illustrates a partial cross-sectional view of the FIG. 3 pixel cell 100. Pixel cell 100 is similar to the pixel cell 10 of FIG. 1, with the exception that the FIG. 4 pixel cell 100 has two series-connected array capacitors 34, 36 electrically connected to the floating diffusion region 18. The charge that is transferred by the transfer transistor gate 16 from the photodiode 12 to the floating diffusion region 18 is shared by the floating diffusion region 18 and the series-connected array capacitors 34, 36. The saturation level of the floating diffusion region 18 thus increases. However, the capacitance of the series-connected array capacitors 34, 36 and the floating diffusion region is not as high as the periphery capacitors as discussed above with respect to FIG. 3.

Figure 5:
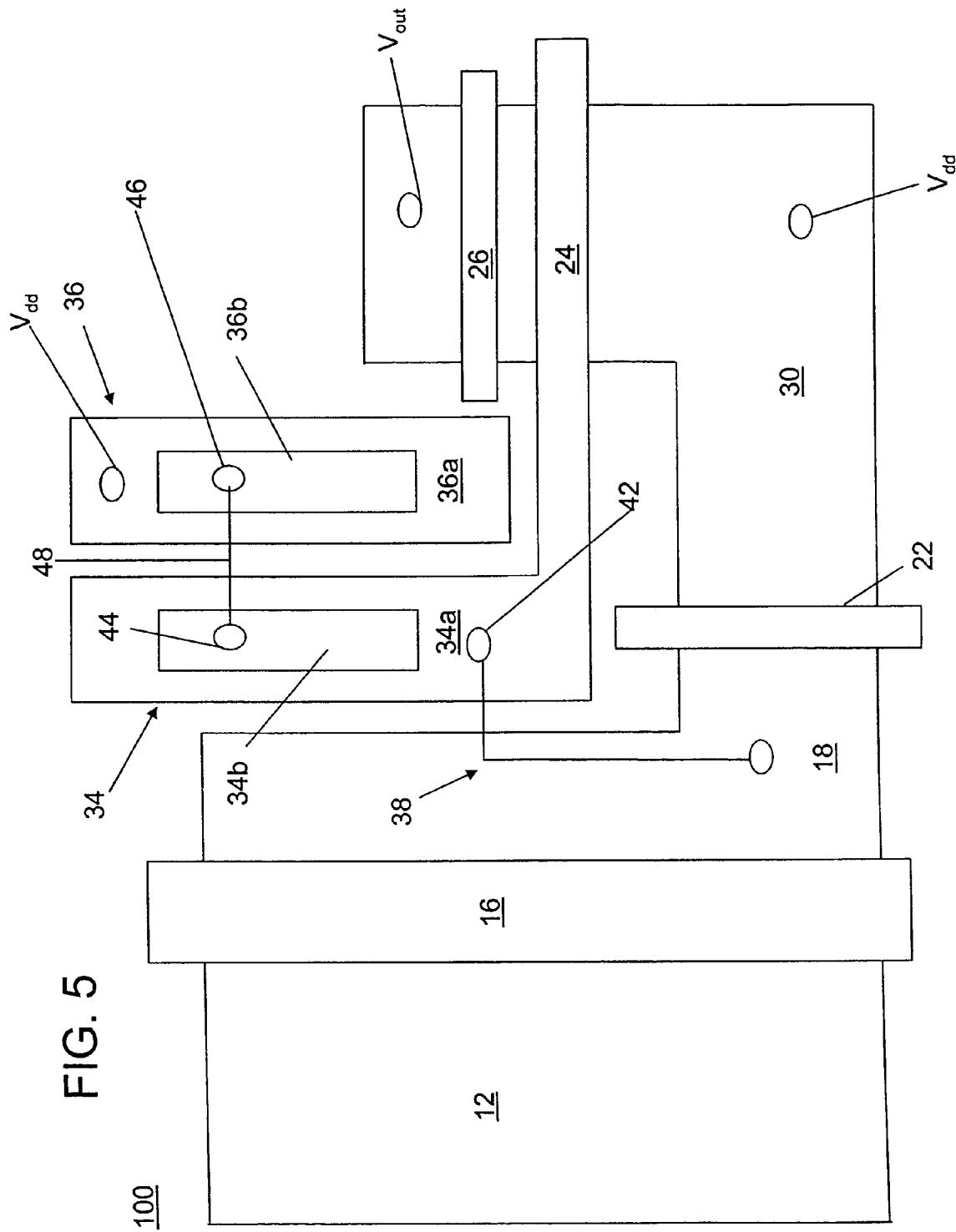
FIG. 5 illustrates a top-down view of the FIG. 3 pixel cell.

FIG. 5 illustrates a top-down view of the FIGS. 3–4 pixel cell 100 constructed in accordance with an exemplary embodiment of the invention. A floating diffusion region 18 is electrically connected to a contact point 42 of a bottom electrode 34a of capacitor 34, via a first connect line 38. Capacitor 34 has a top electrode 34b having a contact point 44, which is connected to a contact point 46 of top electrode 36b of capacitor 36. Capacitor 36 also has a bottom electrode 36a with a contact point coupled to $V_{dd}$. Contact points 44, 46 are electrically connected by conductor 48, thereby placing array capacitors 34, 36 in series with one another. A gate of source follower transistor 24 forms bottom electrode 34a of the first array capacitor 34.

Pixel cell 100 also has a reset transistor with associated gate 22. Prior to charge transfer, the floating diffusion region 18 is set to a predetermined low charge state by turning on the reset transistor having gate 22, which causes electrons in region 18 to flow into a voltage source connected to a source/drain 30. Additionally, pixel cell 100 has a row select transistor with associated gate 26. The charge from the gate of the source follower transistor 24 is conducted to the gate of the row select transistor, which, in turn, conducts it to a column line 28 (FIG. 4) that is connected to readout circuitry (not shown).

Figure 6:
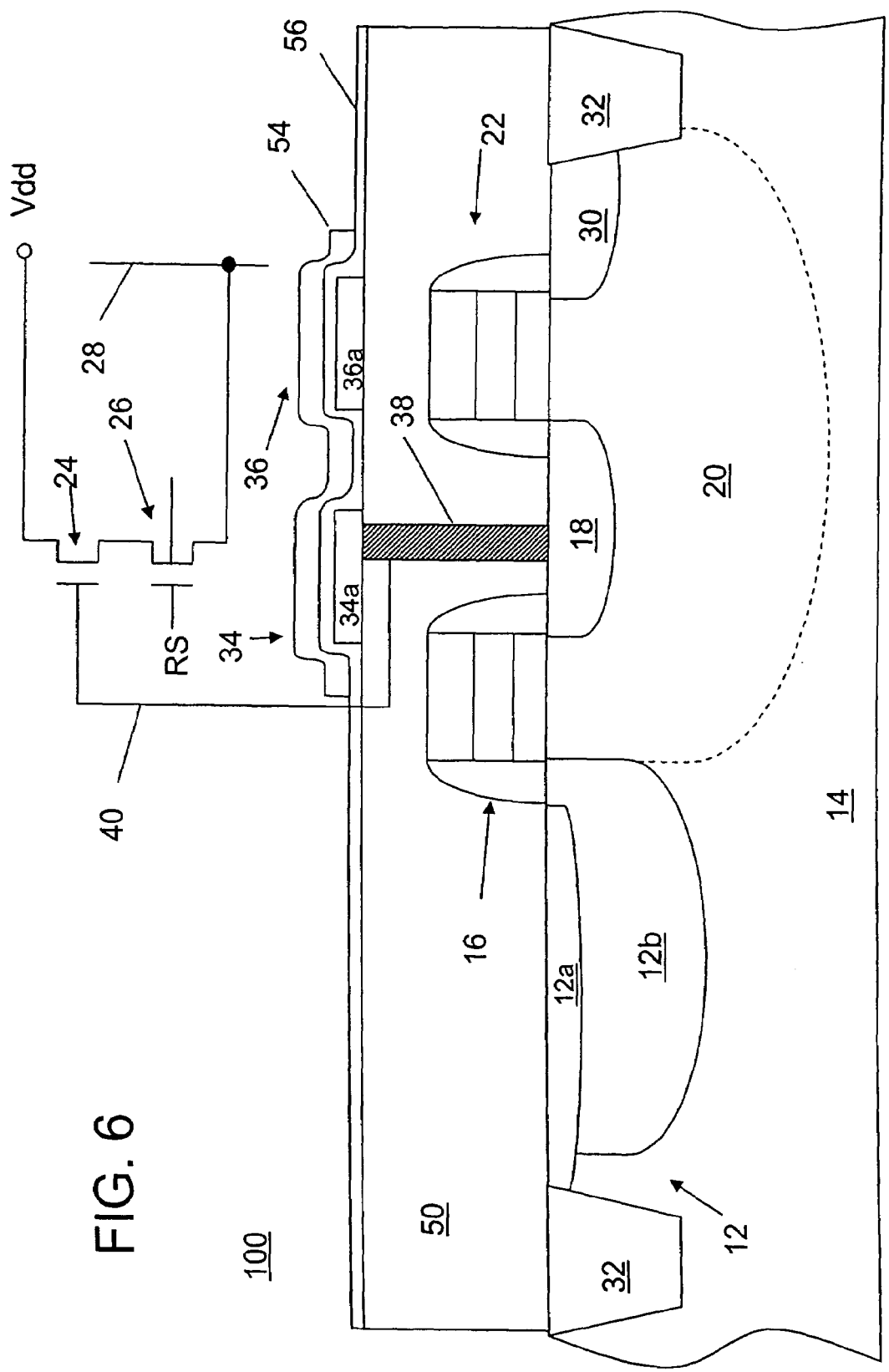
FIG. 6 illustrates a partial cross-sectional view of the FIG. 3 pixel cell.

FIG. 6 illustrates the formation of pixel cell 100 in accordance with an exemplary embodiment of the present invention. The illustrated pixel cell 100 has an insulating layer 50 formed over a pixel cell formed over a semiconductor substrate 14. The insulating layer 50 may be formed of borophosphosilicate glass (BPSG), borosilicate glass (BSG), phosphosilicate glass (PSG), undoped silicate glass (USG), or any other appropriate material.

A portion of the insulating layer 50 is etched away to form a conduit that is filled with conductive material forming a contact 38. Contact 38 connects floating diffusion region 18 to bottom electrode 34a of capacitor 34. Contact 38 also connects the floating diffusion region 18 with a source follower transistor gate 24 by a first connect line 40, shown schematically. Bottom electrode 36a of capacitor 36 is also illustrated as being formed adjacent to bottom electrode 34a. A top electrode layer 54 of the array capacitors 34, 36 is also illustrated as being formed on top of bottom electrodes 34a, 36a. A dielectric layer 56 separates the top electrode layer 54 from the bottom electrodes 34a, 36a. Although array capacitors 34, 36 are illustrated as being formed over transfer gate 16 and reset gate 22, it should be noted that array capacitors 34, 36 could be formed over shallow trench isolation regions 32. It should also be noted that although array capacitors 34, 36 are shown as formed over the insulating layer 50, array capacitors 34, 36 could be formed elsewhere, such as in substrate 14, or in or on subsequently formed layers. Conventional layers of conductors and insulators may also be used to interconnect the structures and to connect the pixel to peripheral circuitry. Such detail, however, is not necessary to describe the invention.

Figure 7:
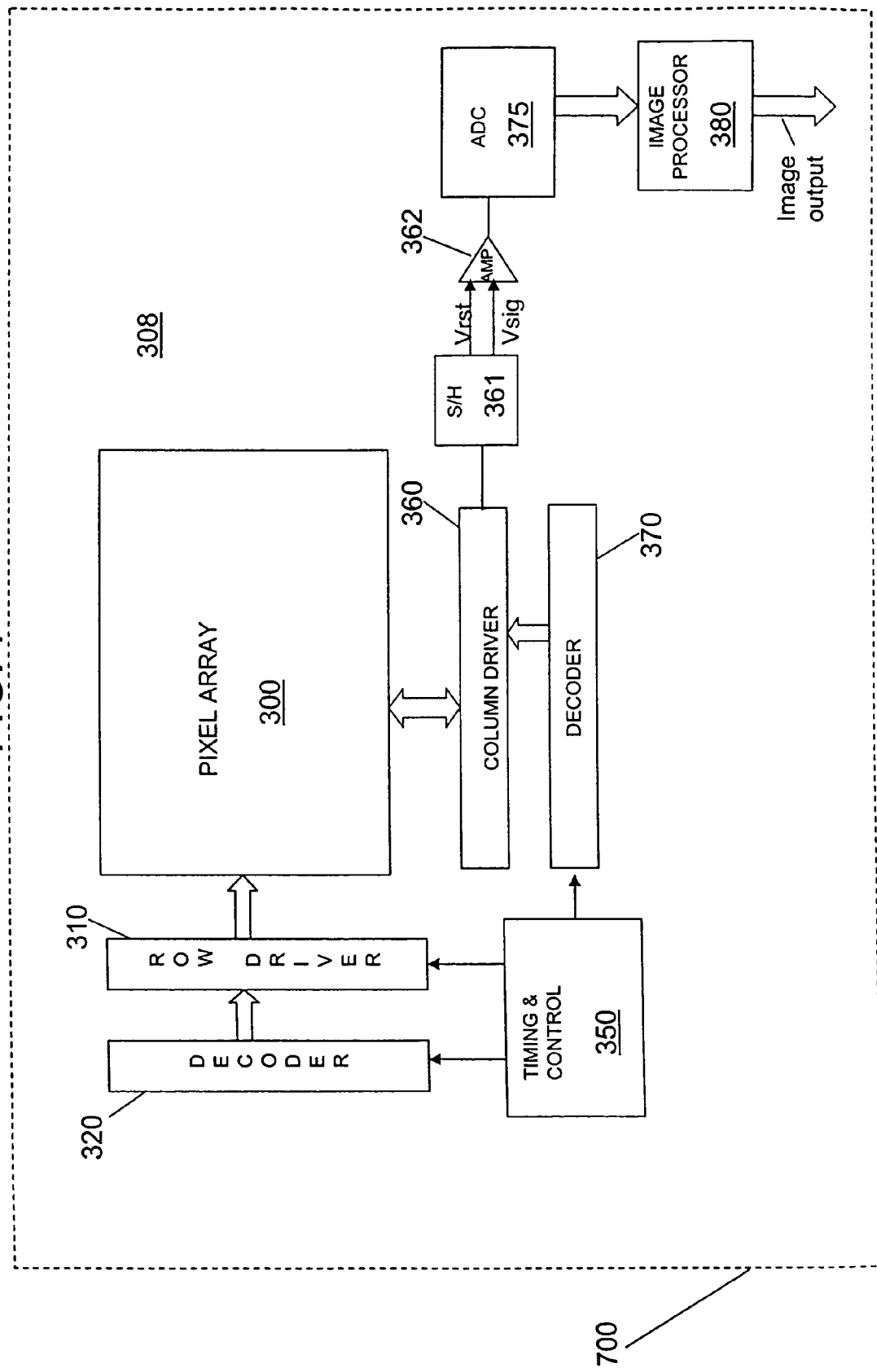
FIG. 7 illustrates a block diagram of a CMOS imager incorporating pixel cells constructed in accordance with FIG. 3.

The pixel cell 100 of FIG. 6 is essentially complete at this stage. Pixel cell 100 may be combined with peripheral circuitry to form an imager device. For example, FIG. 7 illustrates a block diagram of a CMOS imager device 308 having a pixel array 300. Pixel array 300 comprises a plurality of pixels arranged in a predetermined number of columns and rows. The illustrated pixel array 300 contains at least one pixel cell 100 constructed in accordance with exemplary embodiments of the invention as described above with respect to FIGS. 3–6. The pixels 100 of each row in array 300 are all turned on at the same time by a row select line, and the pixels of each column are selectively output by respective column select lines. A plurality of rows and column lines are provided for the entire array 300. The row lines are selectively activated in sequence by the row driver 310 in response to row address decoder 320 and the column select lines are selectively activated in sequence for each row activation by the column driver 360 in response to column address decoder 370. Thus, a row and column address is provided for each pixel 100. The CMOS imager is operated by the control circuit 350, which controls address decoders 320, 370 for selecting the appropriate row and column lines for pixel readout, and row and column driver circuitry 310, 360 which apply driving voltage to the drive transistors of the selected row and column lines.

The pixel output signals typically include a pixel reset signal, $V_{rst}$ taken off of the floating diffusion node (e.g., 18 of FIG. 6) when it is reset and a pixel image signal, $V_{sig}$, which is taken off the floating diffusion node (e.g., 18 of FIG. 6) after charges generated by an image are transferred to it. As described above with respect to FIG. 6, when charge transferred from the photodiode 12 to the floating diffusion region 18 reaches the saturation level of the floating diffusion region 18, the array capacitors 34, 36 are used to store the "surplus" charge. The $V_{rst}$ and $V_{sig}$ signals along with any charge stored by array capacitors 34, 36 (FIG. 6) are read by a sample and hold circuit 361 and are subtracted by a differential amplifier 362, which produces a difference signal ($V_{rst}$-$V_{sig}$) for each pixel 100, which represents the amount of light impinging on the pixels. This signal difference is digitized by an analog to digital converter 375. The digitized pixel difference signals are then fed to an image processor 380 to form a digital image. In addition, as depicted in FIG. 7, the CMOS imager device 308 may be included on a semiconductor chip (e.g., wafer 700).

Figure 8:
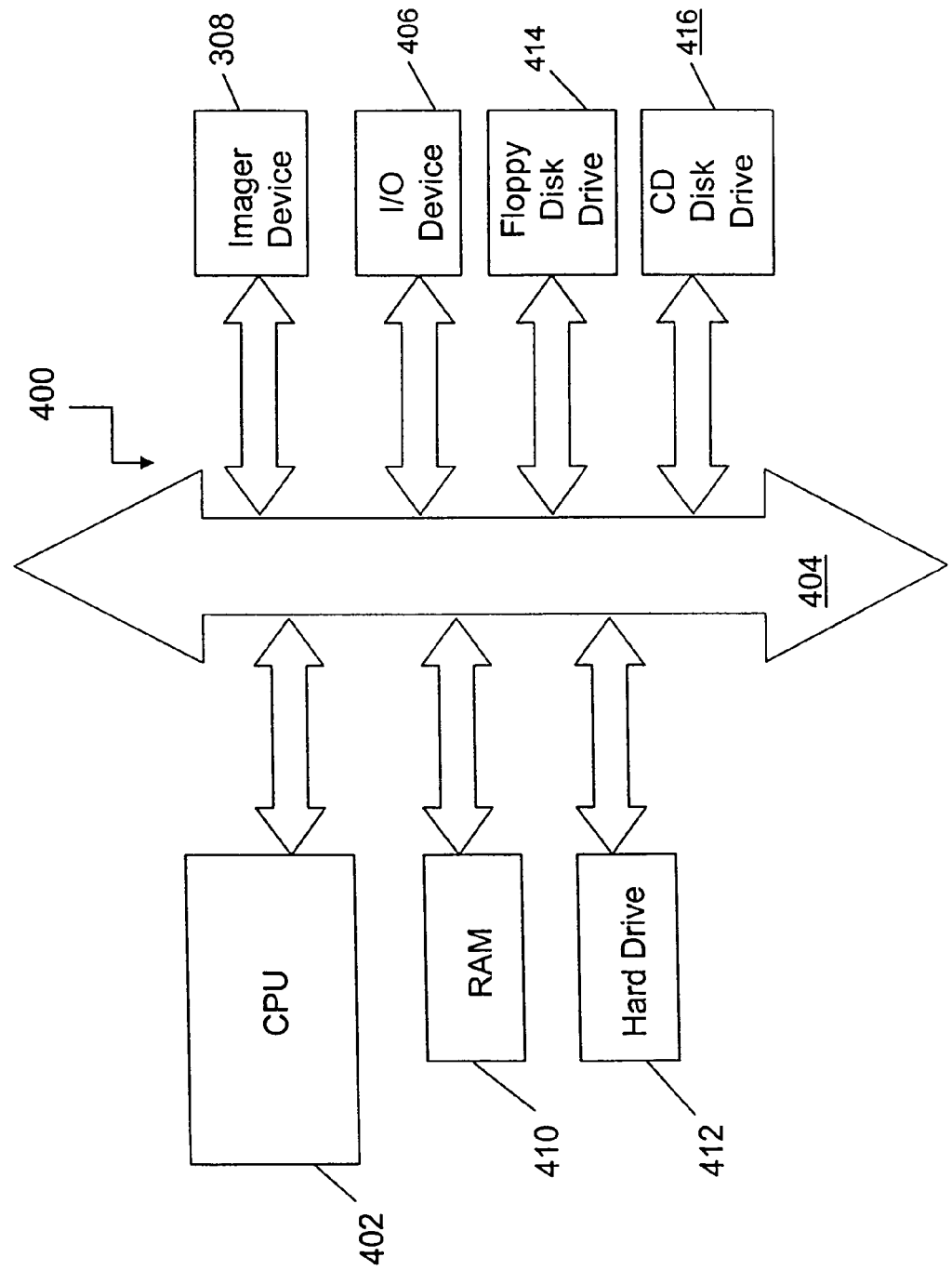
FIG. 8 illustrates a schematic diagram of a processor system incorporating the CMOS imager of FIG. 7 in accordance with an exemplary embodiment of the invention.

FIG. 8 shows system 400, a typical processor based system modified to include an imager device 308 as in FIG. 7. Processor based systems exemplify systems of digital circuits that could include an imager device 308. Examples of processor based systems include, without limitation, computer systems, camera systems, scanners, machine vision systems, vehicle navigation systems, video telephones, surveillance systems, auto focus systems, star tracker systems, motion detection systems, image stabilization systems, and data compression systems for high-definition television, any of which could utilize the invention.

System 400 includes an imager device 308 having the overall configuration depicted in FIG. 7 with pixels of array 300 constructed in accordance with any of the various embodiments of the invention. System 400 includes a processor 402 having a central processing unit (CPU) that communicates with various devices over a bus 404. Some of the devices connected to the bus 404 provide communication into and out of the system 400; an input/output (I/O) device 406 and imager device 308 are examples of such communication devices. Other devices connected to the bus 404 provide memory, illustratively including a random access memory (RAM) 410, hard drive 412, and one or more peripheral memory devices such as a floppy disk drive 414 and compact disk (CD) drive 416. The imager device 308 may receive control or other data from CPU 402 or other components of system 400. The imager device 308 may, in turn, provide signals defining images to processor 402 for image processing, or other image handling operations.

It should again be noted that although the invention has been described with specific references to CMOS pixel cells having two series-connected array capacitors (e.g., 34, 36 of FIG. 6), the invention has broader applicability and may be used in any imaging apparatus. For example, the present invention may be used in conjunction with charge coupled device (CCD) imagers. The above description and drawings illustrate preferred embodiments which achieve the objects, features, and advantages of the present invention. Although certain advantages and preferred embodiments have been described above, those skilled in the art will recognize that substitutions, additions, deletions, modifications and/or other changes may be made without departing from the spirit or scope of the invention. Accordingly, the invention is not

What is claimed as new and desired to be protected by Letters Patent of the United States is:

1. A method of forming a pixel cell, comprising:
providing a substrate with a photosensor formed therein;
coupling a charge collection region to said photosensor;
forming at least two storage capacitors coupled in series with each other,
forming a contact between said series-connected capacitors and said charge collection region, such that said series-connected capacitors are connected in series with said charge collection region.

2. The method of claim 1, wherein one of said series-connected capacitors is formed by the steps of:
providing a first electrode coupled to said contact;
providing a dielectric layer over said first electrode; and
providing a second electrode over said dielectric layer.

3. The method of claim 1, further comprising an insulating layer between said charge collection region and said series-connected capacitors.

4. The method of claim 3, wherein said contact is provided in a conduit formed in said insulating layer.

5. The method of claim 4, wherein said conduit is formed by etching said insulating layer.

6. The method of claim 1, wherein said charge collection region is a floating diffusion region.

7. The method of claim 1, further comprising forming a transfer transistor gate between said photosensor and said charge collection region.

8. The method of claim 1, wherein said photosensor is a photodiode.

9. The method of claim 1, wherein said photosensor is a photogate.

10. A method of forming an integrated circuit, comprising:
providing a semiconductor substrate having an array of pixel cells, wherein at least one of said pixel cells is formed by the steps of:
providing a substrate having a photosensor coupled to a charge collection region;
providing a material layer over said substrate;
forming a conduit within said material layer;
forming a contact within said conduit;
coupling said contact with at least two storage capacitors coupled in series to each other, each of said series-connected capacitors formed by the steps of;
providing a first electrode,
providing a dielectric layer over said first electrode, and
providing a second electrode over said dielectric layer,
coupling one of said first electrodes of said series-connected capacitors to said contact; and
forming signal processing circuitry within said substrate and coupling said circuitry to said array of pixels.

* * * * *